United States Patent
Fujii (10) Patent No.: US 8,688,246 B2
(45) Date of Patent: Apr. 1, 2014

(54) OPERATION MONITORING SYSTEM FOR PROCESSING APPARATUS

(75) Inventor: Yoshinori Fujii, Shizuoka (JP)

(73) Assignee: Ulvac, Inc., Kanagawa (JP)

( * ) Notice: Subject to any disclaimer, the term of this patent is extended or adjusted under 35 U.S.C. 154(b) by 503 days.

(21) Appl. No.: 13/054,107

(22) PCT Filed: Jul. 21, 2009

(86) PCT No.: PCT/JP2009/003413
§ 371 (c)(1),
(2), (4) Date: Feb. 8, 2011

(87) PCT Pub. No.: WO2010/010688
PCT Pub. Date: Jan. 28, 2010

(65) Prior Publication Data
US 2011/0125331 A1  May 26, 2011

(30) Foreign Application Priority Data
Jul. 24, 2008  (JP) ................................. 2008-190629

(51) Int. Cl.
*G06F 19/00* (2011.01)
(52) U.S. Cl.
USPC .................................. 700/45; 700/21; 73/579
(58) Field of Classification Search
USPC ............ 700/45, 56, 21; 73/579, 602; 340/683
See application file for complete search history.

(56) References Cited

U.S. PATENT DOCUMENTS 4,614,117 A * 9/1986 Taniguti ........................... 73/659
4,683,542 A * 7/1987 Taniguti ........................... 702/56

(Continued)

FOREIGN PATENT DOCUMENTS

JP  06-320457 A  11/1994
JP  09-237757 A  9/1997

(Continued)

OTHER PUBLICATIONS

Office Action from Japanese Patent App. No. 2010-521599 (May 21, 2013).
International Search Report for PCT Patent App. No. PCT/JP2009/003413 (Oct. 27, 2009).

*Primary Examiner* — Kidest Bahta
(74) *Attorney, Agent, or Firm* — Cermak Nakajima LLP; Tomoko Nakajima (57) ABSTRACT

In a processing apparatus having: moveable parts disposed to form a predetermined processing environment within a processing chamber in which a predetermined processing is performed on an object to be processed; and a control means for controlling the operation of each of the moveable parts, abnormality inclusive of deterioration with time of the moveable parts constituting the processing apparatus is made to be easily judged. There is provided a vibration detection means for detecting the waveforms of vibrations that occur accompanied by the operation of the moveable parts. When control is made from the control means in order to operate any one of the moveable parts, there are obtained event data corresponding to the control and the waveforms of vibrations of all the moveable parts that are operating simultaneously at the time in question. Each time the control corresponding to the event data is selected, or when a waveform of vibration corresponding to another event data of the same kind as that of the above-mentioned event data has been obtained, the change in the waveform is monitored. When the waveform has changed beyond a predetermined range, the processing apparatus is judged to be abnormal.

12 Claims, 4 Drawing Sheets

(56) References Cited

U.S. PATENT DOCUMENTS

| | | | | |
|---|---|---|---|---|
| 5,206,816 | A | * | 4/1993 | Hill et al. ......................... 702/56 |
| 5,847,658 | A | * | 12/1998 | Irie et al. ......................... 340/683 |
| 6,937,941 | B2 | * | 8/2005 | Hala et al. ....................... 702/33 |
| 7,702,401 | B2 | * | 4/2010 | Eryurek et al. ................. 700/21 |
| 2006/0215347 | A1 | | 9/2006 | Wakabayashi |

FOREIGN PATENT DOCUMENTS

| | | |
|---|---|---|
| JP | 2002-076032 A | 3/2002 |
| JP | 2002-090413 A | 3/2002 |
| JP | 2002-209299 A | 7/2002 |
| JP | 2006-278396 A | 10/2006 |

* cited by examiner

OPERATION MONITORING SYSTEM FOR PROCESSING APPARATUS

This application is a national phase entry under 35 U.S.C. §371 of PCT Patent Application No. PCT/JP2009/003413, filed on Jul. 21, 2009, which claims priority under 35 U.S.C. §119 to Japanese Patent Application No. 2008-190629, filed Jul. 24, 2008, both of which are incorporated by reference.

TECHNICAL FIELD

The present invention relates to an operation monitoring system for a processing apparatus in which the operation of moveable parts constituting the processing apparatus can be monitored from the vibrations at the time of operation of the moveable parts.

BACKGROUND ART

Figure 1:
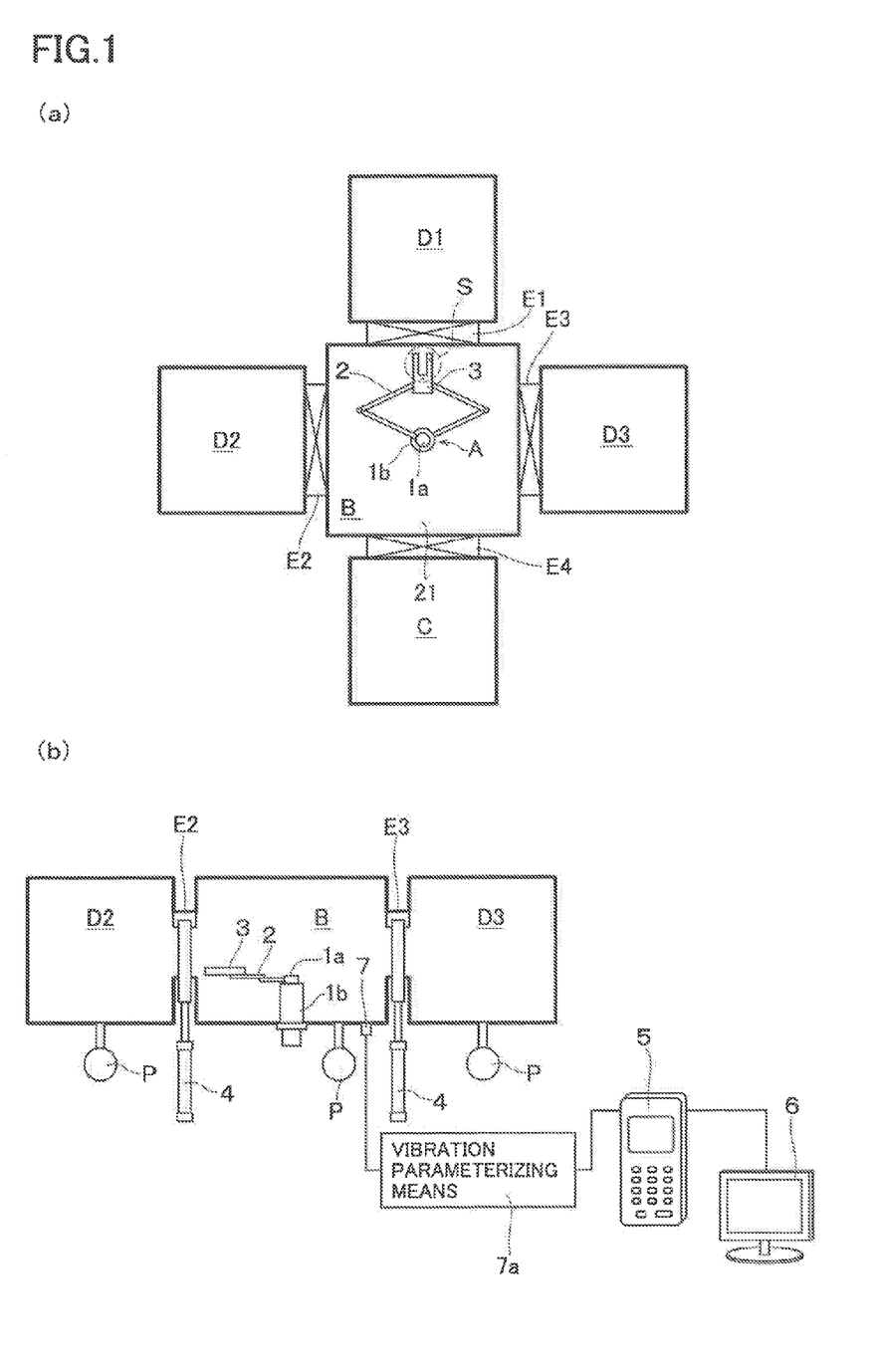
FIGS. 1(a) and 1(b) are plan view and sectional view, respectively, schematically showing a processing apparatus provided with a transfer robot.

As an apparatus for continuously performing various processes such as film-forming processing, etching processing, and the like on a substrate, there is known a processing apparatus (so-called cluster tool apparatus) which is arranged, as shown in FIG. 1; to dispose a load lock chamber C for a substrate S and a plurality of processing chambers D1-D3, through gate valves E1-E4 in a manner to enclose a central transfer chamber B having disposed therein a transfer robot A; and to transfer by the transfer robot A the substrate S that has been fed into the load lock chamber C to each of the processing chambers D or to transfer the substrate S among each of the processing chambers D.

In this kind of processing apparatus there are disposed many moveable parts such as the transport robot A, as well as the gate valves E which are each provided with a driving means for isolating each of the processing chambers D from the transfer chamber B, a cold trap (not illustrated) of coolant circulation system, a vacuum pump P, and the like. These moveable parts form a processing environment for performing a predetermined processing on an object to be processed inclusive of transferring of the substrate. At this time, in order to perform the above-mentioned processing in a better way, it is required that these moveable parts always operate normally. Therefore, each of the moveable parts is provided with a detection means such as an optical sensor and the like so as to be able to monitor the operation thereof. This solution, however, becomes large in the number of constituting parts of the apparatus. In addition, the data to be controlled becomes vast in amount so that a high-performance control means becomes necessary, resulting in a higher cost.

It has so far been proposed to detect the abnormality of the processing apparatus by using a vibration detection means, such as an acceleration sensor, an acoustic emission (AE) sensor and the like that detect the vibrations of the apparatus. For example, in patent document 1 there is disclosed an art in which an acceleration sensor is disposed inside or outside the apparatus, and a stop control means is provided to output a stop signal to stop the apparatus based on the output of this detection means.

However, in the detection of abnormality by the vibration measurement of the prior art, out of the constituting parts of the processing apparatus, the waveforms of vibrations at the time of abnormality of the object whose abnormality detection is going to be performed are obtained in advance, and the abnormality detection is performed based thereon. Therefore, there is a problem in that the object to be measured becomes specific. Further, since a judgment of abnormality is made only when a predetermined threshold value has been exceeded, it is not suitable for controlling the deterioration conditions of moveable parts that are subject to deterioration depending on the frequency of use.

PRIOR ART DOCUMENT

Patent Document
Patent Document 1: JP-A-1997-237757

DISCLOSURE OF THE INVENTION

Problems to be Solved by the Invention

Therefore, in view of the above-mentioned points, this invention has a problem of providing a low-cost operation monitoring system for a processing apparatus, in the operation monitoring system of which the abnormality inclusive of deterioration with age of the moveable parts constituting the processing apparatus can be easily judged.

Means for Solving the Problems

In order to solve the above-mentioned problems, in the operation monitoring system for a processing apparatus according to this invention, the processing apparatus comprises: moveable parts disposed to form a predetermined processing environment within a processing chamber in which a predetermined processing is performed on an object to be processed; and a control means for controlling the operation of each of the moveable parts. The operation monitoring system has a vibration detection means for detecting waveforms of vibrations to be generated accompanied by the operation of the moveable parts. When control by the control means is performed to operate any one of the moveable parts, there are obtained: event data corresponding to the control; and waveforms of vibrations of all the moveable parts that are detected by the vibration detection means and that are moving simultaneously. Each time the control corresponding to the event data is selected, or in case a waveform of vibration corresponding to another event data of a kind similar to the event data is obtained, the change in the waveform is monitored and, if the waveform has changed beyond a predetermined range, the processing apparatus is judged to be abnormal.

According to this invention, when any one of the moveable parts is operated by the control of the control means, waveforms of the vibrations that are generated by the operation of all of the simultaneously moving parts inclusive of the said any one of the moveable parts and that are within the range of transfer of the vibrations are respectively measured by the vibration detection means, and are obtained together with the event data which serves to show the contents of control. When, e.g., a control similar in kind (event data substantially coinciding with each other) is performed by the control means in the same operating environment, the waveform of vibration is detected again by the vibration detection means. A comparison is then made with the vibration data of the previous time that corresponds to the event data. If any of the vibration data changes beyond a predetermined range, a judgment is made as to the necessity of maintenance due to abnormality or deterioration of the processing apparatus. In this invention, the event data means data relating to the content of control (command) to be outputted from the control means when any one of the moveable parts is operated by the control from the control means, and designates command data such as "open gate valve," "operate cold trap," "operate vacuum pump" and the like.

As described above, according to this invention, instead of measuring in advance the waveform of vibration at the time of abnormality of any one of the moveable parts, the soundness of the moveable parts can be easily judged out of the changes in the waveform of vibration corresponding to the specific event data whenever any one of the moveable parts is put into operation. Therefore, in case the waveform of vibration varies with the lapse of time, it becomes possible to monitor even the condition of deterioration of the moveable parts. In addition, since an arrangement is made that the vibrations of all the moveable parts that are operating within the range of transmission of the vibrations are detected and processed, the vibration detection means is not required for individual moveable parts, thereby attaining reduction in cost. Further, as compared with a case in which the information showing the state of each section of the processing apparatus is obtained at a certain cycle and is processed for monitoring the operation, the amount of data to be controlled can be made smaller. It is thus suitable as an operation monitoring system for a processing apparatus, such as cluster tools and the like, having relatively many moveable parts.

According to this invention, in case the control corresponding to the event data is selected and when another waveform of vibration that is not included in the previous waveforms of vibrations is newly detected, a cause for generation of the newly detected vibration is identified and said another waveform based on the cause for generation of vibration is stored in memory. In case said another waveform is detected by the vibration detection means during the operation of any one of the moveable parts, a judgment may be made that the processing apparatus is abnormal. According to this arrangement, in case vibrations beyond the control of the event data have occurred, e.g., when a film adhered to a shield plate disposed on an inner wall of the film-forming chamber has been peeled off, or when a substrate during transfer is damaged, and the like, the abnormality in the processing apparatus can be judged.

If an arrangement is made that the obtained waveform of vibration is stored in a memory or other known memory means after conversion to predetermined characteristics parameters, there is no need of storing a vast amount of data by storing the duration time, the rise time and the fall time of vibrations, maximum amplitude, vibration energy, peak frequency and the like, as compared with the case in which the data of waveforms of vibrations obtained are stored as they are. Further, the judgment of abnormality becomes easy.

The system preferably comprises a display means for displaying the characteristics parameters. Then, the change with lapse of time of the moveable parts can be visualized to the advantage of analyzing and judging the deterioration with the lapse of time.

Preferably, the vibration detection means is made up of a combination of a plurality of sensors having different frequency bands of measurable vibrations to enable to grasp the vibrations of all the moveable parts in operation.

EMBODIMENTS FOR CARRYING OUT THE INVENTION

A description will now be made of an embodiment in which this invention is applied to a processing apparatus as shown in FIG. 1. In other words, a transfer chamber B is provided with a transfer robot A. The transfer robot A has two motors (not illustrated) as driving means. A coaxially disposed rotary shaft 1a, 1b of each of the motors has connected thereto a robot arm 2 to form a link mechanism. At the front end of the link mechanism there is mounted a robot hand 3. According to this arrangement, by appropriately controlling the rotational angle of the rotary shaft 1a, 1b of each of the motors, the robot arm 2 becomes telescopic and rotatable. It becomes thus possible to transfer the substrate S with the robot hand 3 to a predetermined position. The transfer chamber B is coupled to a load lock chamber C and processing chambers D1-D3 through gate valves E1-E4 that are provided with drive means 4 such as air cylinders and the like so that the chambers can be isolated from one another.

The transfer chamber B, the load lock chamber C, and each of the processing chambers D1-D3 have connected thereto an evacuating means P constituted by a rotary pump, a cryopump, or a turbo-pump. Depending on the processing to be performed in each of the processing chambers D1-D3, there is appropriately provided a cold trap (not illustrated) of a known construction at a connection point to each of the processing chambers D1-D3. Further, although not particularly illustrated, the processing chambers D1-D3 and the like are provided with: a vacuum measuring means such as a Pirani gauge, an ion gage, and the like; and a gas introduction means for introducing a predetermined gas. Depending on the predetermined processing, the processing chambers D1-D3 are appropriately provided therein with electrodes and power supplies for forming a discharge plasma.

In order to perform a predetermined processing on the substrate S as an object to be processed such as a semiconductor wafer and the like, the moveable parts in this embodiment are constituted by each of the above-mentioned parts that are appropriately equipped in the transfer chamber B, the load-lock chamber C, and each of the processing chambers D in order to form a predetermined processing environment, e.g., to transfer the substrate S from the load lock chamber C to each of the processing chambers D1-D3 and to form a predetermined vacuum (plasma) atmosphere. The operation of these moveable parts is controlled by a control means 5. The control means 5 has a known construction and is provided, e.g., with a microcomputer. The contents of control (commands) can be programmed in the microcomputer in advance through a personal computer and the like. By sequentially performing the commands, there can be performed a sequence control. Further, the control means 5 has connected thereto a display means 6 such as a liquid crystal display and the like so that the contents of control can appropriately be displayed.

The processing apparatus is provided with vibration detection means 7 to detect the waveforms of vibrations that occur as a result of operation of the respective moveable parts. As the vibration detection means 7 there may be used acceleration sensors, vibration/impact sensors, AE sensors, microphones and the like, all having a known construction. The vibration detection means 7 are connected to the control means 5 through vibration parameterization means (means for converting vibration waveforms into characteristics parameters) 7a which is to be described in detail hereinafter. The vibration detection means 7 is mounted on an outside of the bottom surface, e.g., of the transfer chamber B so that the waveforms of vibrations to occur when each of the moveable parts is operated can be efficiently detected.

Actually, the above-mentioned sensors of a plurality of sets are used in combination so that vibrations in wide bandwidths can be measured from a low-frequency region below 500 Hz such as the vibrations to occur at the time of operation of motors and gate valves E1-E4 to a high-frequency region of 100 kHz to occur when a piston scrubs cylinder wall surface at the time of operation of the cold trap (i.e., so as to enable to monitor the operation of all of the parts that constitute the processing apparatus).

Vibrations of low-frequency region are easy to be transmitted and are hardly attenuated even in case the moveable parts are made of resin and the like material. On the other hand, vibrations of high-frequency region are attenuated by the very interposing of parts made of resin and the like material. Therefore, the mounting position of each of the above-mentioned sensors is appropriately selected taking the above-mentioned vibration characteristics into consideration in order to measure the intended vibrations.

A description will now be made of the operation monitoring of the processing apparatus relating to this embodiment with reference to the following example. In the example in question, a substrate S disposed in the load lock chamber C is transferred to any one of the processing chambers D1-D3 in a state in which the transfer chamber B, the load lock chamber C and each of the processing chambers D1-D3 are kept to a predetermined vacuum degree by operating the evacuating means. First, after confirming that the load lock chamber C has reached a predetermined vacuum degree by the control from the control means 5, two of the gate valves E1-E4 that are present between the transfer chamber B and the load lock chamber C, and between the transfer chamber B and the processing chambers D1-D3 are opened. At this time, detection is made by the vibration detection means 6 (7) of the waveforms of vibrations of the simultaneously operating parts, such as the waveforms of vibrations accompanied by the operation of the gate valves E1-E4, the vibrations accompanied by the operation of the vacuum pump P, and the like.

Figure 2:
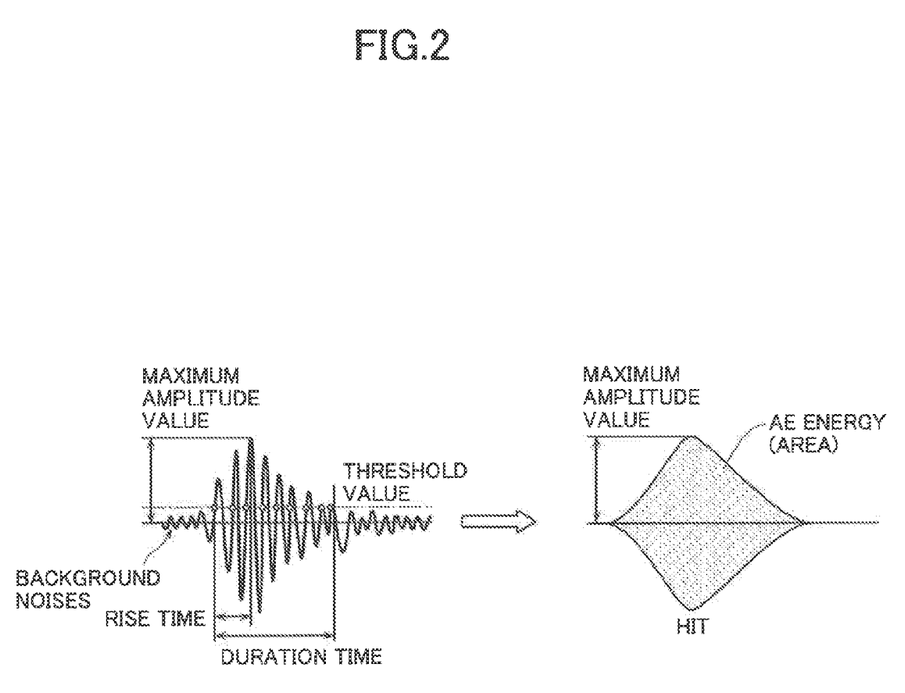
FIG. 2 is a diagram showing the conversion of waveform of vibration detected by the vibration detection means to characteristics parameters.

The waveforms of the measured vibrations are converted into respective characteristics parameters by the vibration parameterization means 7a. A description is made of an example in which the vibrations of the gate valve E1 are detected by the AE sensor. In the vibration parameterization means 7a hit-processing is made of the time of duration of the waveform of vibrations, the rise time and the fall time of the vibrations, the maximum amplitude value, the vibration energy, and the peak frequency of the vibrations as a result of the operation of the detected gate valve E1. In other words, a lump of the waveform to be formed by the envelope detection of the AE waveform is defined as a single signal (hit) and is made into characteristics parameters (see FIG. 2).

The characteristics parameters are outputted to the control means 5 and are stored into memory means such as a memory and the like provided in the control means 5, together with the event data which is the content of control (command) by the control means 5 of "open gate valve E1" (in the actual processing, in case any one of the moveable parts is operated by the control from the control means 5, the waveforms of all the simultaneously operating and vibrating moveable parts are detected, and they are subjected to hit-processing for respective conversion into characteristics parameters and storing in memory). According to this arrangement, synchronization becomes easy between the event data and the characteristics parameters of the vibration waveforms. As a result of a combined effect of conversion into characteristics parameters and of obtaining the data (data relating to the event data and characteristics parameters) only when any one of the moveable parts is operated, the necessity of storing a vast amount of data can be eliminated.

Figure 3:
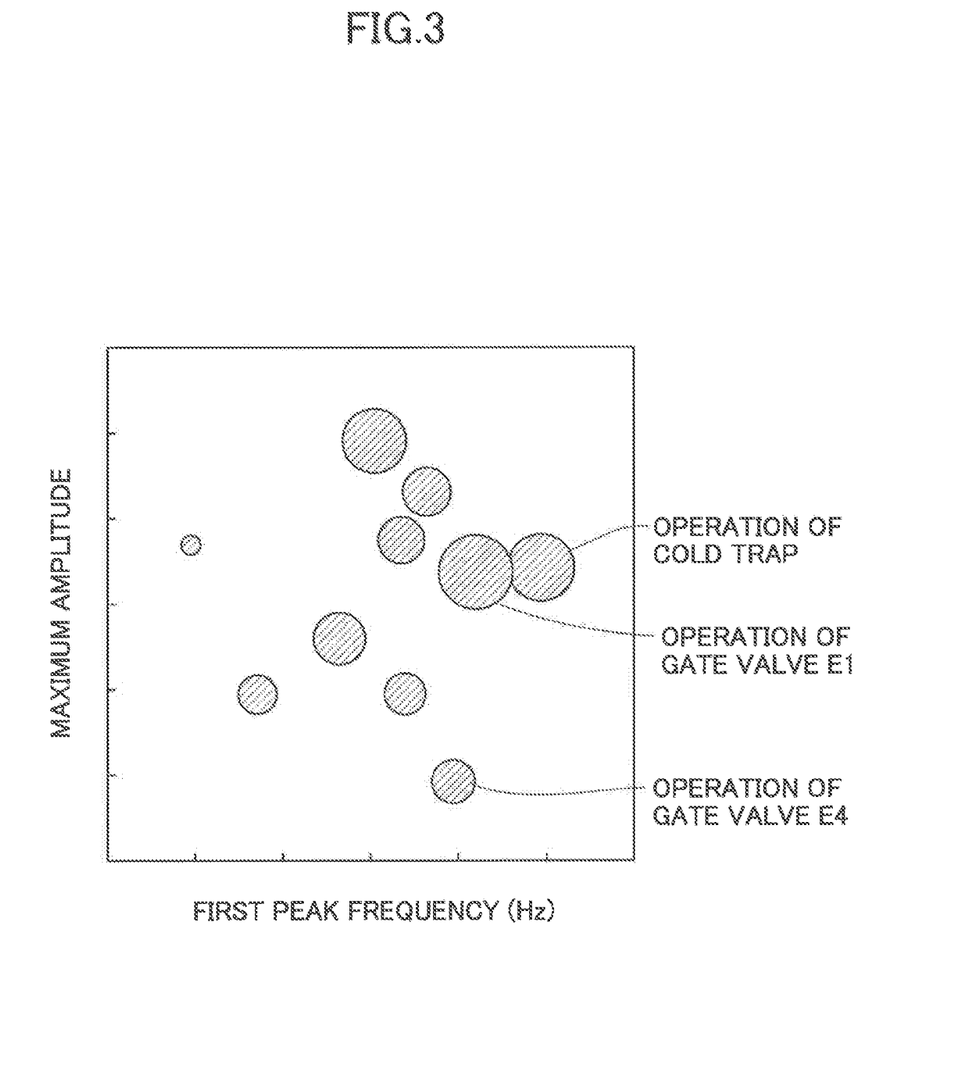
FIG. 3 is a diagram showing an example of displaying the characteristics parameters in display means.

The obtained characteristics parameters can be displayed on the display means 6. In this case, it is preferable to display them in the form of a bubble chart (scatter diagram) in which the vibration energy is represented by the size of a circle in which, e.g., X-axis is defined as a first peak value of the vibration waveform, and the Y-axis is defined as the maximum amplitude of the vibration waveform (see FIG. 3). According to this arrangement, the vibrations of each of the moveable parts corresponding to the event data can be visualized. The bubble chart is suitable for visualizing the characteristics of waveform data having a multiplicity of characteristics parameters by using the size of the circle represented on the X-Y axes, color of the circle, height of the circle, and the like.

Figure 4:
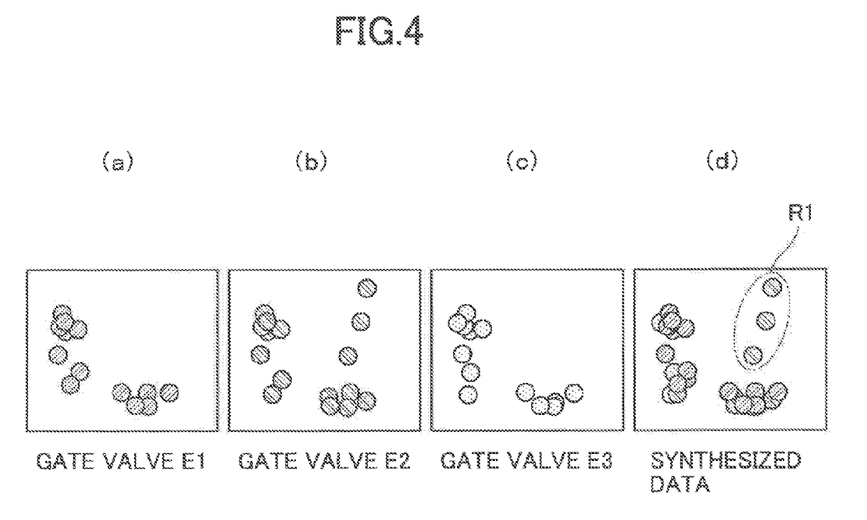
FIGS. 4(a) through 4(d) are diagrams showing an example of abnormality detection by the operation monitoring system according to this invention.

When the obtained characteristics parameters are accumulated for a certain period of time, the normally generated vibrations tend to gather together in a specific region of the bubble chart. Therefore, as shown in FIG. 4, by accumulating the characteristics parameters and displaying them on the display means 6 inclusive of the number of occurrences, the other vibrations generated for reasons other than the operation of the moveable parts can be immediately distinguished because they appear in regions other than the above-mentioned specific region (they will be more remarkably represented if the event data and the corresponding characteristics parameters are deleted).

In such a case, the operation, e.g., of the processing apparatus is stopped and the cause for the generation of the vibrations in question is identified. Then, the other vibration data based on the causes for generation of the vibrations are stored in the memory means. It is thus so arranged that, when the other vibration data are detected by the vibration detection means 7 while any one of the moveable parts is in operation, a judgment is made that the processing apparatus is abnormal. According to this arrangement, in case there should occur vibrations attributable to a cause that cannot be controlled by the event data, such as AE waves (around 200 kHz) that occur when films adhered to shield plates disposed on the inside walls of the processing chambers D1-D3 have been peeled off, it becomes possible to judge the abnormality of the processing apparatus inclusive of the necessity of maintenance thereof.

Suppose that the same control is made by the control means 5, i.e., a command of "open gate valve E1" is issued under the same working environment in which, e.g., the load lock chamber C and each of the processing chambers D1-D3 are kept at a predetermined vacuum degree, and the like, or suppose that the same kind of control is made such as the transfer of the substrate S from any one of the processing chambers to another processing chamber (e.g., "open gate valve E2"; event data substantially coinciding with each other). Then, the waveforms of vibrations that occur simultaneously are respectively detected again by the vibration detection means 7 and are converted into characteristics parameters. The characteristics parameters corresponding to the event data of the previous vibrations are compared with each other. Out of the deviation of the characteristics parameters relative to the time base and out of the change in the area of the AE energy, a judgment is made of the necessity of maintenance of the processing apparatus due to abnormality or deterioration thereof. According to this arrangement, not only can monitoring be made of the operation of the motors, gate valves, and cold traps, but also can monitoring be made: e.g., of the occurrence of anomalous discharge (arcing) when plasma processing is performed in the processing chamber; of dropping of the substrate S out of position of the robot hand during transferring thereof by the transfer robot A; and the like.

A description will now be made of an example in which abnormalities of the moveable parts were detected in the operation monitoring of the processing apparatus in the embodiment of this invention. When the gate valves E1-E3 are respectively operated by the control means 5 in a state in which the transfer chamber B, the load lock chamber C and each of the processing chambers D1-D3 are kept at a predetermined vacuum degree (when the event data are of the same kind), the waveforms of vibrations are measured by the vibration detection means 7, and the measured waveforms of vibrations are converted into the characteristics parameters, and scatter diagrams are prepared based on the characteristics parameters (see FIGS. 4(a) through 4(c)). Then, when these scatter diagrams are superimposed (see FIG. 4(d)), it can be seen that abnormal vibrations (the region represented by reference mark R1) were detected by the vibration detection means 7 only when the gate valve E2 was put into operation. It can thus be found out that abnormalities have happened to the gate valve E2. In such a case, the gate valve E2 will be replaced in its entirety.

On the other hand, when the gate valve E1 is operated in a state in which the transfer chamber B, the load lock chamber C and each of the processing chambers D1-D3 are kept by the control means 5 at a predetermined vacuum degree, the waveforms of vibrations are measured by the vibration detection means 7, and the measured waveforms of vibrations are converted into the characteristics parameters, and scatter diagrams at that time are prepared based on the characteristics parameters (see FIG. 5(a)). Then, when the above-mentioned control is selected by the control means 5 under the same environment (in case the event data are the same), the waveforms of vibrations are measured each time, and they are converted into characteristics parameters to thereby form a scatter diagram. The scatter diagram is superimposed on the one that has been prepared last time and is displayed.

Figure 5:
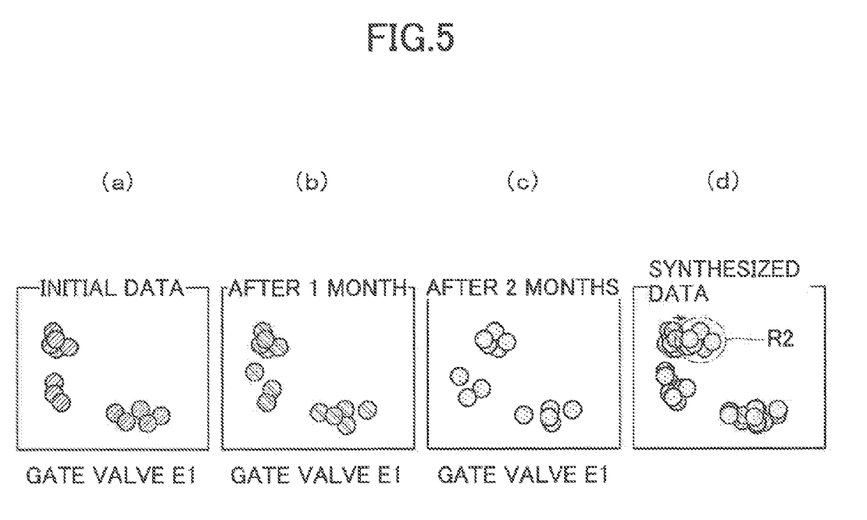
FIGS. 5(a) through 5(d) are diagrams showing another example of abnormality detection by the operation monitoring system according to this invention.

By superimposing each of the scatter diagrams in this manner (see FIG. 5(d)), it can be seen that changes have occurred to the vibrations to be measured by the vibration detection means 7 when the service time of the gate valve E1 becomes long (in FIG. 5, the region designated by reference mark R2 has shifted to the right). It can thus be seen that an abnormality may occur or has already occurred to the gate valve E1. In such a case, the gate valve E1 is replaced in its entirety.

As described so far, according to the embodiment of this invention, each time any one of the moveable parts is operated, the soundness of the moveable part can easily be judged out of the changes in waveform of vibrations corresponding to the specific event data. In particular, when the waveform of the particular vibration is varying with the lapse of time, the conditions of deterioration of the moveable parts can be realized. Further, since all of the vibrations of the moveable parts that are operating are detected and processed within the range of reach of the vibrations, vibration detection means is not required for individual moveable parts, thereby contributing to the reduction in cost.

In this embodiment, a description has been made of an example of operation of the gate valve under a certain environment. However, without being limited thereto, this invention can be applied to the moveable parts accompanied by the generation of vibrations with their operation, and the operation thereof can be kept under control. In addition, a description has been made of an example in which the waveforms of vibrations are converted to characteristics parameters and displayed in the form of bubble charts. However, as long as the obtained characteristics parameters can be displayed in superimposition, any kind of embodiment is acceptable such as line graphs and the like.

DESCRIPTION OF REFERENCE NUMERALS AND CHARACTERS 5 control means
6 display means
7 vibration detection means
B transfer chamber
C load lock chamber
D1-D3 processing chamber
E1-E4 gate valve
P evacuating means
S substrate

What is claimed is:

1. An operation monitoring system for a processing apparatus, the processing apparatus comprising:
   moveable parts disposed to form a predetermined processing environment within a processing chamber in which a predetermined processing is performed on an object to be processed; and
   a control means for controlling the operation of each of the moveable parts,
   the operation monitoring system having a vibration detection means for detecting waveforms of vibrations to be generated accompanied by the operation of the moveable parts,
   wherein, when control by the control means is performed to operate any one of the moveable parts, there are obtained: event data corresponding to the control; and waveforms of vibrations of all the moveable parts that are detected by the vibration detection means and that are moving simultaneously, and
   only when any one of the movable parts corresponding to the event data is operated, the change in the waveform is monitored and, if the waveform has changed beyond a predetermined range, the processing apparatus is judged to be abnormal.

2. The operation monitoring system for a processing apparatus according to claim 1, wherein in case the control corresponding to the event data is selected and when another waveform of vibration that is not included in the previous waveforms of vibrations is newly detected, a cause for generation of the newly detected vibration is identified and said another waveform based on the cause for generation of vibration is stored in memory, and
   in case said another waveform is detected by the vibration detection means during the operation of any one of the moveable parts, a judgment is made that the processing apparatus is abnormal.

3. The operation monitoring system for a processing apparatus according to claim 1, wherein the obtained waveform of vibration is stored in memory after conversion to predetermined characteristics parameters along with the event data.

4. The operation monitoring system for a processing apparatus according to claim 3, further comprising a display means for displaying the characteristics parameters.

5. The operation monitoring system for a processing apparatus according to claim 1, wherein the vibration detection means is made up of a combination of a plurality of sensors having different frequency bands of measurable vibrations.

6. The operation monitoring system for a processing apparatus according to claim 2, wherein the obtained waveform of vibration is stored in memory after conversion to predetermined characteristics parameters.

7. The operation monitoring system for a processing apparatus according to claim 6, further comprising a display means for displaying the characteristics parameters.

8. The operation monitoring system for a processing apparatus according to claim 2, wherein the vibration detection means is made up of a combination of a plurality of sensors having different frequency bands of measurable vibrations.

9. The operation monitoring system for a processing apparatus according to claim 3, wherein the vibration detection means is made up of a combination of a plurality of sensors having different frequency bands of measurable vibrations.

10. The operation monitoring system for a processing apparatus according to claim 6, wherein the vibration detection means is made up of a combination of a plurality of sensors having different frequency bands of measurable vibrations.

11. The operation monitoring system for a processing apparatus according to claim 4, wherein the vibration detection means is made up of a combination of a plurality of sensors having different frequency bands of measurable vibrations.

12. The operation monitoring system for a processing apparatus according to claim 7, wherein the vibration detection means is made up of a combination of a plurality of sensors having different frequency bands of measurable vibrations.

* * * * *